United States Patent [19]
Yacobi et al.

[11] Patent Number: 5,079,616
[45] Date of Patent: Jan. 7, 1992

[54] SEMICONDUCTOR STRUCTURE

[75] Inventors: Ben G. Yacobi, Natick; Stanley Zemon, Brookline; Chirravuri Jagannath, Needham, all of Mass.

[73] Assignee: GTE Laboratories Incorporated, Waltham, Mass.

[21] Appl. No.: 154,836

[22] Filed: Feb. 11, 1988

[51] Int. Cl.$^5$ .................. H01L 29/04; H01L 29/161; H01L 27/04; H01L 29/34
[52] U.S. Cl. ........................... 357/60; 357/61; 357/50; 357/52; 437/126; 437/132; 437/133; 437/234
[58] Field of Search .................... 357/60, 50, 52, 61; 437/233, 126, 132, 133, 234

[56] References Cited

U.S. PATENT DOCUMENTS

| | | | |
|---|---|---|---|
| 3,963,538 | 6/1976 | Broadie et al. | 357/60 |
| 4,065,742 | 12/1977 | Kendall et al. | 357/60 |
| 4,632,712 | 12/1986 | Fan et al. | 357/60 |
| 4,806,996 | 2/1989 | Luryi | 357/16 |

OTHER PUBLICATIONS

"Semiconductor Hetero Junction Topics: Introduction and Overview" Milnes, Solid State Electronics, vol. 29, #2, 1986, pp. 91–121.
"Residual Stress in GaAs Layer Grown on 4°6—OFF (100) Si By MBE", Yao et al., Materials Research Society Symposia Proceedings, vol. 91, 1987, pp. 63–68.
"Epitaxial GaAs on Si: Progress and Potential Applications" Shaw, Materials Research Society Symposia Proceedings, vol. 91, 1987, pp. 15–30.
"Selective Patterning of Single-Crystal GaAs/Ge Structures on Si Substrates by Molecular Beam Epitaxy", Sheldon et al., J. Vac. Sci. Technol., vol. A3, #3, May/Jun. 1985, pp. 883–886.

Primary Examiner—Rolf Hille
Assistant Examiner—Wael Fahmy
Attorney, Agent, or Firm—Victor F. Lohmann, III

[57] ABSTRACT

Heteroepitaxial semiconductor structures of, for example, GaAs on InP or Si. The epitaxially grown GaAs is in the form of individual spaced-apart islands having maximum dimensions in the plane of the surface of the substrate of no greater than 10 micrometers. In islands of this size stress in the plane of the epitaxially grown layers due to mismatch of the coefficients of thermal expansion of the substrate and epitaxially grown materials is insignificant.

7 Claims, 2 Drawing Sheets

SEMICONDUCTOR STRUCTURE

BACKGROUND OF THE INVENTION

This invention relates to semiconductor materials. More particularly, it is concerned with heteroepitaxial semiconductor structures and methods of manufacturing.

Recently there has been increased interest in various electronic and opto-electronic devices fabricated in heteroepitaxial semiconductor structures; that is, semiconductor structures employing a substrate of one semiconducting or insulating material with an epitaxially grown layer of a different semiconductor material on the substrate. One significant problem in structures of this type is the presence of stress in the plane of the epitaxially grown layer. The epitaxially grown layer is unstressed at the growth temperature which typically is about 600° C. Upon cooling, however, stress is produced in the epitaxial layer because of the difference in the coefficients of thermal expansion of the substrate material and the epitaxially grown layer. The presence of such stress has a significant effect on devices fabricated in the heteroepitaxial structure. The stress causes modification of the band structure of the epitaxially grown material and thus affects both the optical and electrical properties of the semiconductor material of the layer. In addition, there may be stress-induced migration of dislocations in the crystal structure of the epitaxial layer causing degradation of opto-electronic devices fabricated in the heteroepitaxial structure.

SUMMARY OF THE INVENTION

An improved semiconductor structure in accordance with the present invention comprises a substrate of essentially single crystal insulating or semiconducting material and an epitaxial layer of single crystal semiconductor material on a surface of the substrate. The semiconductor material of the epitaxial layer has a different coefficient of thermal expansion from that of the substrate material. The epitaxial layer consists of a plurality of individual islands of single crystal semiconductor material spaced from each other and having sufficiently small dimensions that no significant stress is present in the crystal structure.

In accordance with another aspect of the invention, the method of fabricating a semiconductor structure comprises providing a substrate of essentially single crystal insulating or semiconducting material. An epitaxial layer consisting of a plurality of individual islands of single crystal semiconductor material is formed on a surface of the substrate. The semiconductor material of the epitaxial layer has a different coefficient of thermal expansion from that of the substrate material. The islands are spaced from each other and have sufficiently small dimensions so that no significant stress is present in the crystal structure.

BRIEF DESCRIPTION OF THE DRAWINGS

In the drawings:

FIGS. 1A, 1B, and 1C are elevational views in cross-section, and FIGS. 1D and 1E are perspective views;

FIGS. 2A, 2B, and 2D are elevational views in cross-section, and FIGS. 2C and 2E are perspective views.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following discussion and appended claims in connection with the above-described drawings.

DETAILED DESCRIPTION

The present invention is concerned with the epitaxial growth of semiconductor materials on substrates of essentially single crystal semiconducting or insulating materials. More specifically, the heteroepitaxial structures and their methods of manufacture are directed to compound semiconductor materials epitaxially grown on substrates of compound semiconductor materials, or silicon, or, for example $Al_2O_3$. The compound semiconductor materials of concern include III-V compound semiconductor materials of two or more constituents such as GaAs, InP, InAs, InGaAs, GaAlAs, and InGaAsP, and also combinations thereof which form III-V heterojunction materials such as GaAlAs/GaAs and InGaAsP/InP. Also of concern are the II-VI compound semiconductor materials. In order for the epitaxially grown material to be of device quality the substrate is essentially single crystal material. Substrates of $Al_2O_3$ (sapphire or alumina) may have a large number of discontinuities in their single crystal structure relative to single crystal silicon and still be considered as essentially single crystal for the purpose of serving as a substrate for the growth of heteroepitaxial layers of compound semiconductor materials.

In fabricating structures and devices in accordance with the present invention as illustrated in the figures, a substrate of single crystal semiconducting or insulating material is provided as a supporting structure or substrate. As is well understood, the substrate is usually a slice or wafer of relatively large surface area upon which many identical structures are fabricated simultaneously. However, for purposes of illustration only a fragment of a slice is shown and described.

Figure 1A:
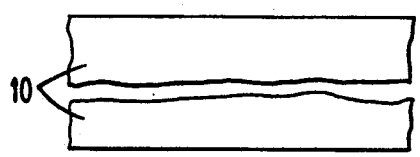
Figs 1A-1E are a series of views of a fragment of a semiconductor body illustrating successive steps in the fabrication of a heteroepitaxial semiconductor structure in accordance with the present invention.
Figure 1B:
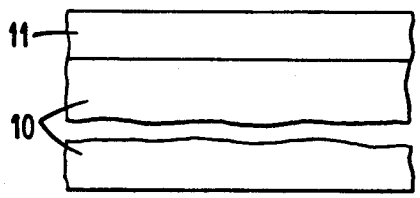

FIG. 1A illustrates a fragment of a substrate 10 of essentially single crystal insulating or semiconducting material. As illustrated in FIG. 1B, an epitaxial layer 11 of a different single crystal material which is thermally mismatched to the substrate by having a different coefficient of thermal expansion is grown on the flat, planar upper surface of the substrate 10. The epitaxial layer 11 is about 2 to 5 micrometers thick and may be grown by any of various conventional techniques such as molecular beam epitaxy (MBE) or metalorganic vapor phase epitaxy (MOVPE) techniques. The epitaxially grown layer 11 has a flat, planar upper surface parallel to the surface of the substrate.

Figure 1C:
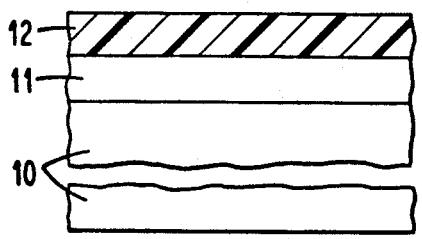
Figure 1D:
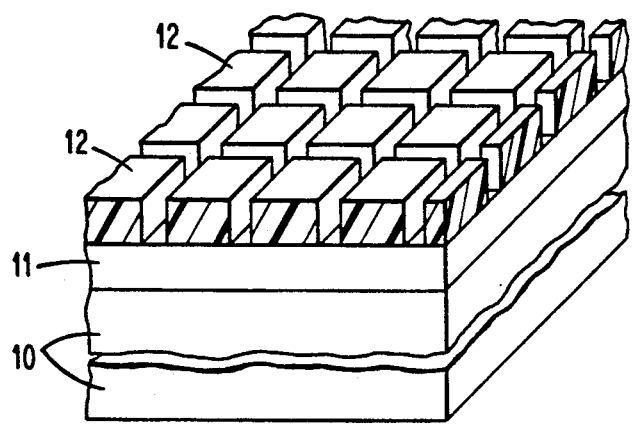

The upper surface of the epitaxial layer 11 is covered with a suitable photoresist material 12 as shown in FIG. 1C. By employing standard photolithographic techniques portions of the photoresist layer are removed to produce intersecting grooves as illustrated in FIG. 1D. The grooves in the photoresist 12 expose portions of the upper surface of the epitaxial layer 11, while leaving protected a plurality of surface areas each individually encircled by the pattern of grooves in the photoresist 12.

Figure 1E:
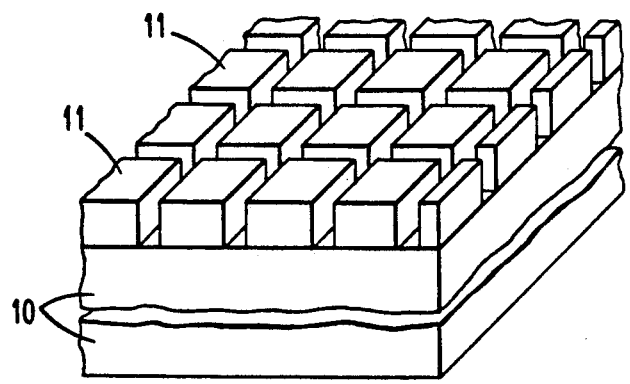

The assembly of FIG. 1D is treated by etching in a suitable etching solution so as to remove material of the epitaxial layer 11 in the pattern exposed by the grooves in the photoresist 12. The remaining photoresist 12 is then removed leaving the resulting structure as shown in FIG. 1E. As illustrated in FIG. 1E the resulting structure is a substrate 10 of the original insulating or semiconducting material having on its upper surface an array or a plurality of individual islands of the epitaxially grown semiconductor material. Each of the islands is isolated or spaced from the other islands. Each of the islands is fabricated so as to have a maximum dimension in the plane of its upper surface which is sufficiently small so that there is no significant stress in its crystal structure.

More specifically, single crystal GaAs may be grown on a substrate of single crystal InP by molecular beam epitaxy employing, for example, a Perkin Elmer-MBE 400system. The GaAs is grown on InP at a temperature of about 580° C. The epitaxial GaAs layer is of the order of 5 micrometers thick. The photoresist mask is formed by conventional photolithographic techniques. The GaAs is removed to produce the grooves by immersing in a 2:1:10 $NH_4OH:H_2O:H_2O$ etching solution which removes GaAs at a rate of about 1 micrometer per minute. Although the islands may be of any desired configuration, they are illustrated as square. The maximum dimensions between opposite edge surfaces is approximately 10 micrometers. The spacing between islands is about 1 micrometer.

Figure 2A:
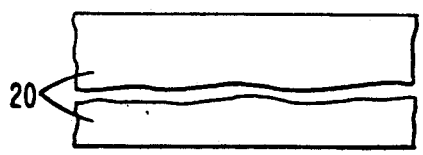
FIGS. 2A-2E are a series of views of a fragment of a semiconductor body illustrating successive steps in the fabrication of a heteroepitaxial semiconductor structure by an alternative method.
Figure 2B:
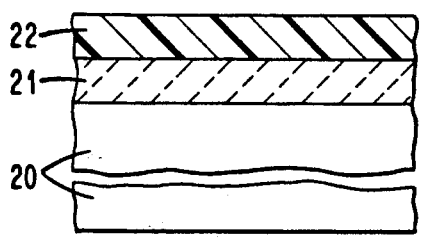
Figure 2C:
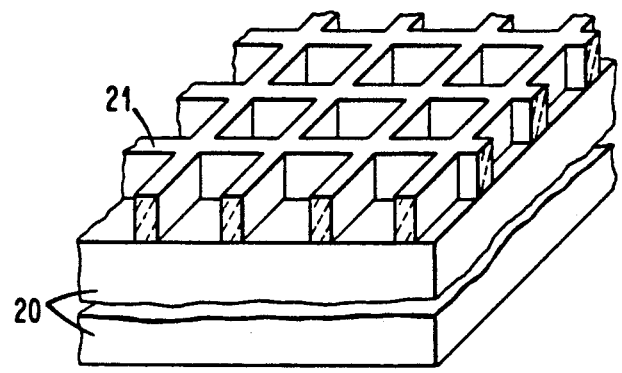
Figure 2D:
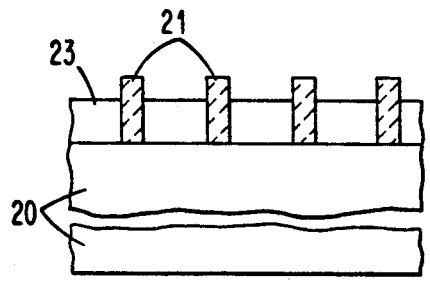
Figure 2E:
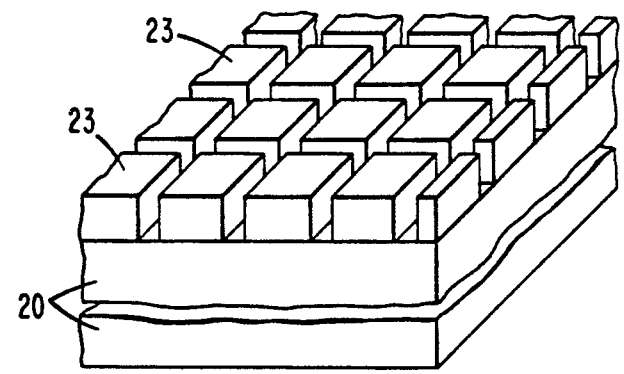

An alternative method of fabricating a structure as described is illustrated by FIGS. 2A through 2E. The substrate 20 as illustrated in FIG. 2A is of single crystal semiconducting or insulating material. As illustrated in FIG. 2B the upper surface of the substrate 20 is coated with a layer 21 of suitable protective material. The layer 21 may be constituted of layers of silicon dioxide and silicon nitride to form the desired adherent protective coating. The protective layer 21 is covered with a layer of photoresist 22. By employing conventional photolithographic masking and etching techniques the protective layer 21 is selectively removed to expose the upper surface of the substrate 20 in a pattern of individual areas separated from each other by a mask of an intervening network of protective material 21 as illustrated in FIG. 2C. Semiconductor material is then grown on the exposed surface areas of the substrate 20 in the pattern of the voids in the masking layer 21 by conventional epitaxial techniques as illustrated in FIG. 2D. Following the growth of the epitaxial layer 23 to the desired thickness, the masking material 21 is removed by etching in a suitable etching solution. The resulting structure as illustrated in FIG. 2E includes the substrate 20 having disposed on its upper surface an array or plurality of individual islands 23 of epitaxially grown semiconductor material. Techniques for patterning epitaxial growth in this manner are discussed in detail in an article entitled, "Selective patterning of single-crystal GaAs/Ge structures on Si substrates by molecular beam epitaxy", by P. Sheldon et al., which was published in J. Vac. Sci. Technol. A3(3), May/June 1985.

Figure 3:
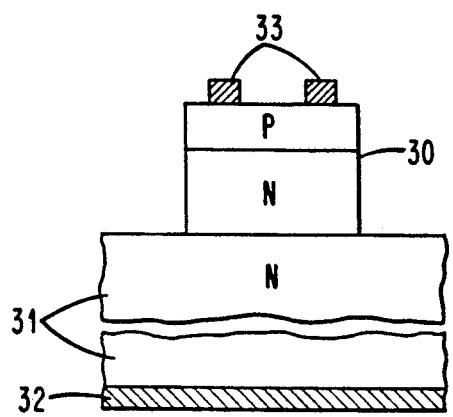
FIG. 3 is an elevational view in cross-section illustrating an exemplary opto-electronic device fabricated in a portion of the heteroepitaxial structure of FIGS. 1E or 2E.

FIG. 3 is a representation in cross-section of a single island 30 and adjacent portions of a substrate 31 containing an opto-electronic device, specifically a photodiode. As illustrated the substrate 31 is doped to be N-type. The epitaxial island 30 contains a rectifying junction of compound semiconductor material, and may consist of different layers, for example GaAs and AlGaAs, appropriately doped as they are grown. A metal layer 32 forms a common ohmic contact to the substrate 32 and a metal contact 33 is in ohmic contact with the upper surface of the P-type material.

In studying the stress in layers of compound semiconductor material epitaxially grown on substrates having mismatched coefficients of thermal expansion, heteroepitaxial structures were fabricated in accordance with the method illustrated in FIGS. 1A through 1E. GaAs was grown on InP by molecular beam epitaxy at a temperature of 580° C., and GaAs was grown on Si at a temperature of 600° C. with a thin Ge buffer layer between the Si and GaAs. The thicknesses of the epitaxial layers were 4.25 micrometers and 5.7 micrometers for the GaAs on the InP and on the Ge/Si substrates, respectively. Structures of various configurations were fabricated with dimensions between surface edges ranging from 10 micrometers to 200 micrometers. Cathodoluminescence scanning electron microscopy studies were conducted to measure the stress in the patterns of epitaxially grown GaAs. The measurements were performed using JEOL 840 scanning electron microscopy equipment with a modified Oxford Instruments liquid helium attachment. An electron beam energy of 20 keV and an electron beam current of about 50 nanoamperes were used, and the experiments were performed at a temperature of about 20 K.

The measurements indicate that the stress is relatively insignificant at convex corners It is believed that the material of the epitaxial layer is under uniform biaxial tensile stress in the plane of the layer. At an edge surface the component of stress perpendicular to the edge is zero since the lattice structure is free to relax perpendicular to the edge. That is, at an edge the stress is a uniaxial stress parallel to the edge. At the intersection of two edges, a convex corner, where the stress components perpendicular to both the edges are zero, the stress is, in effect, zero. It has been determined that within approximately 10 micrometers of an edge surface the edge stress is uniaxial. Thus, when the dimensions of the islands between surface edges are no greater than approximately 10 micrometers, for practical purposes the stress is zero Thus, the characteristics of electronic and opto-electronic devices fabricated in islands of such size are not degraded by stress due to the thermal mismatch between the materials of the substrate and epitaxial layer.

While there has been shown and described what is considered a preferred embodiment of the present invention, it will be obvious to those skilled in the art that various changes and modifications may be made therein without departing from the invention as defined by the appended claims

What is claimed is:

1. A semiconductor structure comprising
   a substrate of essentially single crystal insulating or semiconducting material having a flat, planar surface;

an epitaxial layer of single crystal semiconductor material on said surface of the substrate, said semiconductor material having a different coefficient of thermal expansion from that of the substrate material;

said epitaxial layer consisting of an array of individual islands of single crystal semiconductor material spaced from each other, each island having a flat, planar upper surface; and the flat, planar upper surfaces of said islands lying in a common plane substantially parallel to said surface of the substrate;

each of said islands having edge surfaces extending from the upper surface to the surface of the substrate; and the maximum distance between edge surfaces of each island being no greater than about 10 micrometers.

2. A semiconductor structure in accordance with claim 1 wherein
the spacing between individual islands is about 1 micrometer.

3. A semiconductor structure in accordance with claim 2 wherein
each of the islands is square.

4. A semiconductor structure in accordance with claim 3 wherein
each of said islands is between about 2 to about 5 micrometers thick.

5. A semiconductor structure in accordance with claim 4 wherein
the material of said substrate is silicon or sapphire; and
the semiconductor material of said islands is a compound semiconductor material.

6. A semiconductor structure in accordance with claim 4 wherein
the material of said substrate is InP; and
the semiconductor material of said islands includes GaAs.

7. A semiconductor structure in accordance with claim 4 wherein
each of said islands contains the elements of a semiconductor electronic or opto-electronic device.

* * * * *